United States Patent
Hu et al.

(10) Patent No.: US 6,819,277 B1
(45) Date of Patent: Nov. 16, 2004

(54) METHOD FOR REDUCING SPIKES IN A DIGITAL-TO-ANALOG CONVERTER

(75) Inventors: Jen-Yi Hu, Taipei (TW); Wein-Town Sun, Kao-Hsiung (TW)

(73) Assignee: Au Optronics Corp., Hsin-Chu (TW)

( * ) Notice: Subject to any disclaimer, the term of this patent is extended or adjusted under 35 U.S.C. 154(b) by 0 days.

(21) Appl. No.: 10/604,896

(22) Filed: Aug. 25, 2003

(30) Foreign Application Priority Data

May 2, 2003 (TW) .................................... 92112076 A

(51) Int. Cl.[7] .............................................. H03M 1/66
(52) U.S. Cl. ..................... 341/144; 341/341; 341/136; 341/154
(58) Field of Search ............................. 341/144, 145, 341/154, 120, 118, 136

(56) References Cited

U.S. PATENT DOCUMENTS

| | | | | |
|---|---|---|---|---|
| 4,146,882 A | * | 3/1979 | Hoff et al. ............... | 341/138 |
| 5,274,373 A | * | 12/1993 | Kanoh .................... | 341/118 |
| 5,831,566 A | * | 11/1998 | Ginetti ................... | 341/144 |
| 5,969,657 A | * | 10/1999 | Dempsey et al. ......... | 341/145 |
| 6,567,026 B1 | * | 5/2003 | Gorman .................. | 341/154 |

* cited by examiner

Primary Examiner—Brian Young
Assistant Examiner—John B Nguyen
(74) Attorney, Agent, or Firm—Winston Hsu

(57) ABSTRACT

A method is used for reducing spikes in a digital-to-analog converter (DAC), which includes a plurality of digit circuits for transforming a digital voltage signal into an analog voltage signal. The method includes receiving the digital voltage signal, setting the digit circuit corresponding to a predetermined bit of the digital voltage signal closest to an output module, and outputting an analog voltage signal corresponding to the digital voltage signal, wherein the predetermined bit of the digital voltage signal is the bit with least signal variation among the bits of the digital voltage signal.

8 Claims, 5 Drawing Sheets

| Fourth bit | Fifth bit | Sixth bit | DACP | DACN |
|---|---|---|---|---|
| 0 | 0 | 0 | 0.5V | 0V |
| 0 | 0 | 1 | 1V | 0.5V |
| 0 | 1 | 0 | 1.5V | 1V |
| ⋮ | | | ⋮ | ⋮ |
| 1 | 0 | 1 | 3.5V | 3V |
| 1 | 1 | 1 | 4V | 3.5V |

Fig. 4

METHOD FOR REDUCING SPIKES IN A DIGITAL-TO-ANALOG CONVERTER

BACKGROUND OF INVENTION

1. Field of the Invention

The invention relates to a method for reducing spikes in a digital-to-analog converter, and more particularly, to a method for setting a digit circuit that corresponds to a predetermined bit of the digital voltage signal with least signal variation closest to an output module for reducing spikes in a digital-to-analog converter.

2. Description of the Prior Art

Liquid display devices (LCD), which are thin, flat panel display devices, can be found in a plethora of electronic goods, ranging from notebook computers and digital cameras to flight avionics and medical diagnostic tools. LCDs offer crisp, high-resolution images, and have the primary advantage of offering relatively low power-consumption rates while still maintaining good color contrast and screen refresh rates. In recent years, the newly developed low-temperature Poly Silicon LCD (LTPS LCD) can directly attach the driving circuit on the glass substrate so that the quantity of the driving circuits can be reduced, the package/material cost can be downsized, and the reliability and compactness of the commercialized products can be significantly increased.

In an electric circuit, the spikes are generally generated from the power source. In U.S. Pat. No. 6,348,783, "DC/DC converter for suppressing effects of spike noise", Tateishi et al. disclose an AC/DC transformer for erasing spikes. Regarding display systems, for achieving advantages of power saving, integrity, and cost effectiveness, more LCD systems adopt the digital type of input data so that the digital-to-analog converter should be involved in the data driver. Therefore, the quality of the LCD system relies on the transformation process in the digital-to-analog converter. During the transformation process, spikes generated in the digital-to-analog converter are significantly related to the quality of display since the spikes would lead to the unstable displaying and redundant power consumption. Therefore, effective spike reduction in the digital-to-analog converter becomes a crucial topic for display systems. Nowadays, the type of the digital-to-analog converter in the display system includes the R-string digital-to-analog converter (R-string DAC), the C-string digital-to-analog converter (C-string DAC), and the mixed-type digital-to-analog converter. The R-string digital-to-analog converter most seriously suffers from the spikes. Please refer to FIG. 1, which is a schematic diagram of an R-string digital-to-analog converter 10 according to the prior art. The digital-to-analog converter 10 is a 3-to-3 R-string digital-to-analog converter 10 for transforming a 6-bit digital voltage signal into an analog voltage signal. As shown in FIG. 1, the digital-to-analog converter 10 includes a receiving circuit 12, six digit circuits 14–19, a reference circuit 20, and an output module 22. The receiving circuit 12 is used for receiving the 6-bit digital voltage signal, and for respectively being electrically connected to the six digit circuits 14–19. The reference circuit 20 is used to provide nine different reference voltages for the six digit circuits 14–19. The nine different reference voltages are respectively 0V, 0.5V, 1V, 1.5V, 2V, 2.5V, 3V, 3.5V, and 4V. The six digit circuits 14–19 include a first digit circuit 14 to a sixth digit circuit 19, and the six digit circuits 14–19 (the first digit circuit 14 to the sixth digit circuit 19) respectively correspond to six bits of the digital voltage signal (a first bit to a sixth bit). For example, the first digit circuit 14 corresponds to the first bit of the digital voltage signal. In addition, each digit circuit includes a plurality of transistors. For instance, the fourth digit circuit 17 to the sixth digit circuit 19 (respectively corresponding to the fourth bit to the sixth bit of the digital voltage signal) respectively include sixteen PMOS-transistors or NMOS transistors, and the first digit circuit 14 to the third digit circuit 16 (respectively corresponding to the first bit to the third bit of the digital voltage signal) respectively include eight PMOS transistors or NMOS transistors. When being implemented, the six digit circuits combined with resistors as shown in FIG. 1 can operate a voltage-separating function and transform the digital voltage signal into an analog voltage signal corresponding to the digital voltage signal. Afterwards, after a related current will flow to the output module 22, the output module 22 can output the transformed analog voltage signal to a data line. Therefore, the magnitude of the analog voltage signal determines the light intensity of a pixel in a panel. In addition, as shown in FIG. 1, the output module 22 further includes a loading resistor 24, which is an essential element for the digital-to-analog converter 10, used for impedance matching.

Please continue to refer to FIG. 1. In the prior-art digital-to-analog converter 10, the third digit circuit 16 (corresponding to the third bit of the digital voltage signal) is closest to the output module 22. Actually, according to the prior art, there is no rule to determine which digit circuit should be closet to the output module 22 or farthest from the output module 22. Please notice that, in the R-string digital-to-analog converter 10, the composition and arrangement of the PMOS transistors and the NMOS transistors are predetermined and unchangeable. For instance, the fourth digit circuit 17 corresponding to the fourth bit of the digital voltage signal includes eight PMOS transistors and eight NMOS transistors, and the arrangement of the PMOS transistors and the NMOS transistors in the fourth digit circuit 17 should conform to the embodiment shown in FIG. 1. Please notice that the first digit circuit 14 to the third digit circuit 16 (corresponding to the first bit to the third bit of the digital voltage signal) respectively includes four PMOS transistors and four NMOS transistors, however, the arrangements of the first digit circuit 14 to the third digit circuit 16 are different.

Please refer to FIG. 2, which is a simulation diagram of the outputted analog voltage signal of the prior-art R-string digital-to-analog converter 10 shown in FIG. 1. The horizontal axis represents variation of time, and the vertical axis represents variation of an output voltage. As shown in FIG. 2, the value of the analog voltage signal can reflect serious spike interference, and the maximum spike value can reach 3V, which is even larger than the original value of the analog voltage signal. Moreover, the minimum spike value is 0.6V. Therefore, the above-mentioned spike interference may cause unstable displaying detected by bare eyes and significantly redundant power consumption. After detailed analyses for the R-string digital-to-analog converter 10 shown in FIG. 1, we found that the spikes mainly come from the loading resistor 24 included in the output module 22. However, the loading resistor 24 is essential and unchangeable for the digital-to-analog converter 10. Therefore, we have to find out a new method without modifying the loading resistor 24 to reduce spikes.

SUMMARY OF INVENTION

It is therefore a primary objective of the claimed invention to provide a method for reducing spikes in the digital-to-analog converter to solve the above-mentioned problems.

In the claimed invention, based on the structure of an R-string digital-to-analog converter, we disclose an arrangement to set a digit circuit that corresponds to a predetermined bit of the digital voltage signal with least signal variation closest to an output module for reducing spikes in a digital-to-analog converter. Therefore, we can eliminate unstable displaying and redundant power consumption without the need of additional installation of electric devices.

According to the claimed invention, a method for transforming a digital voltage signal into an analog voltage signal to reduce spikes by utilizing a digital-to-analog converter is disclosed. The digital-to-analog converter comprises a plurality of digit circuits, wherein each digit circuit respectively corresponds to a bit of the digital voltage signal. The method comprises: receiving the digital voltage signal; setting the digit circuit corresponding to a predetermined bit of the digital voltage signal closest to an output module; and outputting an analog voltage signal corresponding to the digital voltage signal; wherein the predetermined bit of the digital voltage signal is the bit with least signal variation among the bits of the digital voltage signal.

According to the claimed invention, a digital-to-analog converter for transforming a digital voltage signal into an analog voltage signal is disclosed. The digital-to-analog converter comprises: a receiving circuit for receiving the digital voltage signal; a plurality of digit circuits electrically connected to the receiving circuit for transforming the digital voltage signal into an analog voltage signal corresponding to the digital voltage signal, each digit circuit corresponding to a bit of the digital voltage signal; and an output module electrically connected to a digit circuit that corresponds to a bit with least signal variation among the bits of the digital voltage signal for outputting the transformed analog voltage signal, the output module comprising a loading resistor for impedance matching.

These and other objectives of the present invention will no doubt become obvious to those of ordinary skill in the art after reading the following detailed description of the preferred embodiment, which is illustrated in the various figures and drawings.

BRIEF DESCRIPTION OF DRAWINGS

FIG. 4 is a list diagram of a detailed embodiment of the structure shown in FIG. 3.

DETAILED DESCRIPTION

Figure 1:
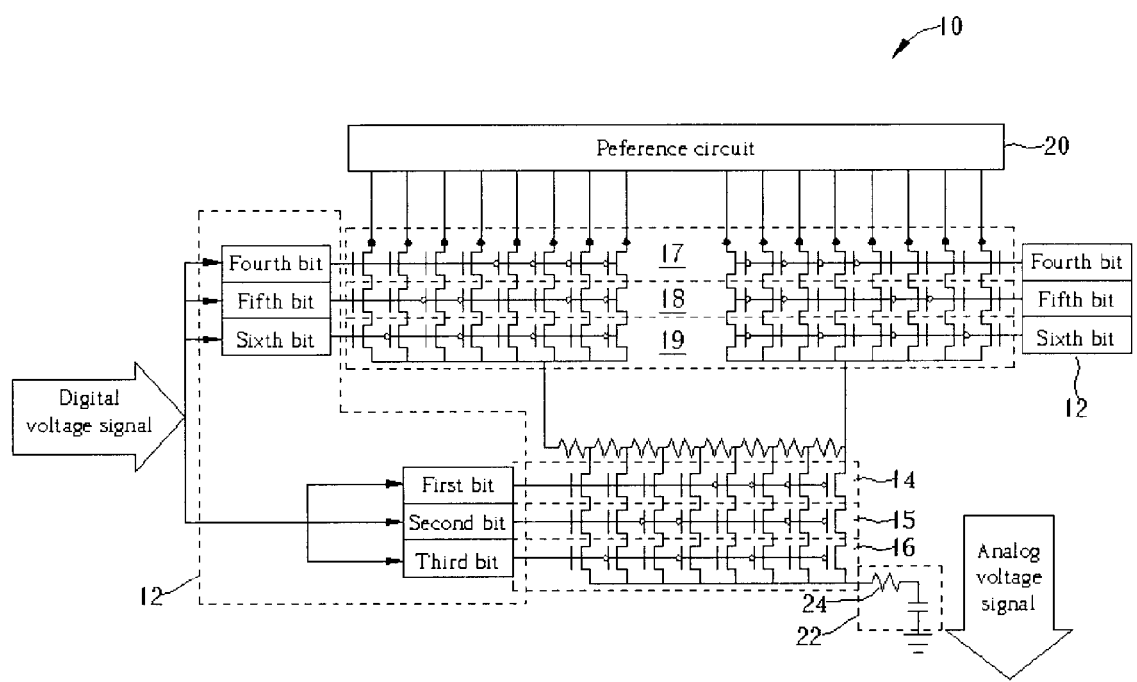
FIG. 1 is a schematic diagram of an R-string digital-to-analog converter according to the prior art.
Figure 3:
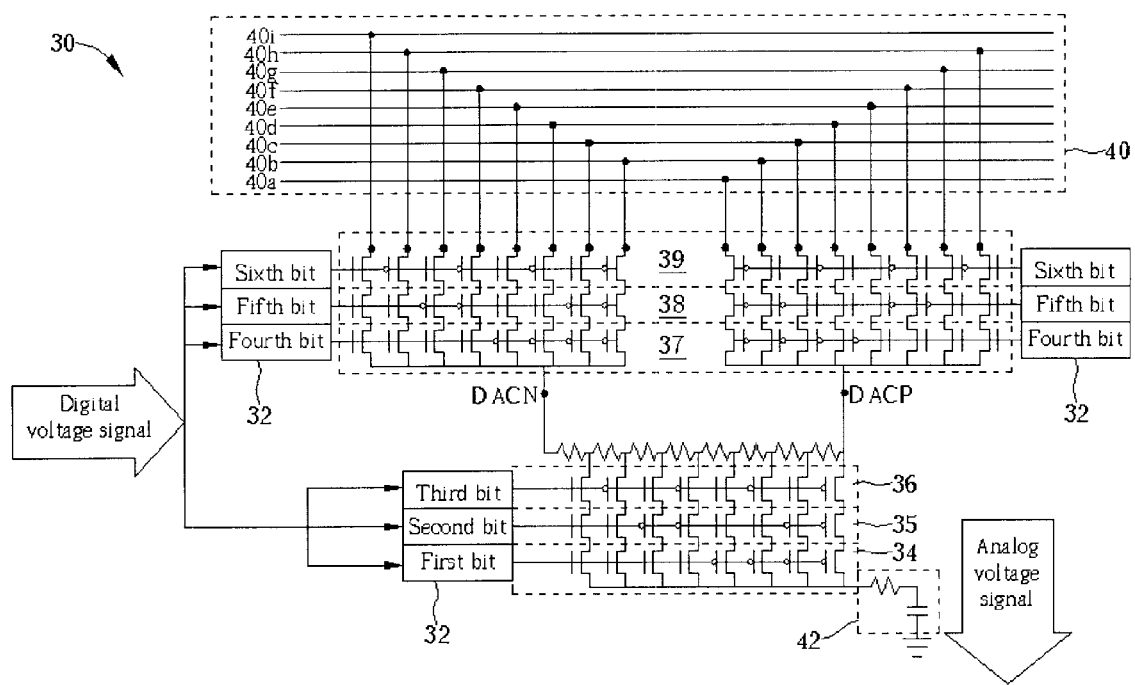
FIG. 3 is a schematic diagram of an R-string digital-to-analog converter according to the present invention.

First of all, a digital image, as a gray-scaled image, is composed of a plurality of signals of various frequencies, and the differences among those frequencies generally conform to a certain rule. During the forming process of the digital image, such as the gray-scaled image, we found that there is a bit of the digital voltage signal having with least signal variation (logic value varied from 0 to 1 or from 1 to 0) along the time (horizontal) axis. The discovery is the most important base for the characteristics of the present invention. Please refer to FIG. 3, which is a schematic diagram of an R-string digital-to-analog converter 30 according to the present invention. The digital-to-analog converter 30 is a 3-to-3 R-string digital-to-analog converter 30 for transforming a 6-bit digital voltage signal into an analog voltage signal. As shown in FIG. 3, the digital-to-analog converter 30 includes a receiving circuit 32, six digit circuits 34–39, a reference circuit 40, and an output module 42. The receiving circuit 32 is used to receive the 6-bit digital voltage signal and the receiving circuit 32 is electrically connected to the six digit circuits 34–39. The reference circuit 40 is used to provide nine different reference voltage 40a–40i, and the nine different reference voltages 40a–40i are respectively 0V, 0.5V, 1V, 1.5V, 2V, 2.5V, 3V, 3.5V, and 4V. The first digit circuit 34 to the sixth digit circuits 39 (in the six digit circuits 34–39) respectively corresponds to the first bit to the sixth bit of the digital voltage signal, and each digit circuit includes a plurality of transistors. For instance, the fourth digit circuit 37 to the sixth digit circuits 39 (corresponding to the fourth bit to the sixth bit of the digital voltage signal) respectively includes sixteen PMOS transistors or NMOS transistors (NMOS), and the first digit circuit 34 to the third digit circuit 36 (corresponding to the first bit to the third bit of the digital voltage signal) respectively includes eight PMOS transistors or NMOS transistors. Please notice that the major difference of the R-string digital-to-analog converter 30 of the present embodiment and the prior-art R-string the digital-to-analog converter 10 shown in FIG. 1 is the arrangement of the digit circuits. According to the characteristics of the present invention, the R-string digital-to-analog converter 30 shown in FIG. 3 is restricted to set the first digit circuit 34 (corresponding to the first bit of the digital voltage signal) closest to the output module 42, and the first bit of the digital voltage signal is determined to be a bit with least signal variation among the six bits of the digital voltage signal.

When the 6-bit digital voltage signal is transmitted to the R-string digital-to-analog converter 30 from the receiving circuit 32, combined with the nine reference voltage 40a–40i provided by the reference circuit 40, the fourth digit circuit 37 to the sixth digit circuits 39 (corresponding to the fourth bit to the sixth bit of the digital voltage signal) will first determine two voltages, DACN and DACP. The relation between the two voltages (DACN and DACP) and the fourth bit to the sixth bit of the digital voltage signal can refer to FIG. 4, which is a list diagram of a detailed embodiment of the structure shown in FIG. 3. As shown in FIG. 4, there is a difference of 0.5V between the two voltages, DACN and DACP, and the voltage DACN is determined by the reference voltages 40b–40i(0.5V–4V), while the voltage DACP is determined by the reference voltages 40a–40h (0V–3.5V). Afterwards, by the operation of the resistors shown in FIG. 3, each resistor close to the third digit circuit 36 will have a voltage drop (0.5V/8=0.04V). Therefore, the first digit circuit 34 to the third digit circuit 36 corresponding to the first bit to the third bit of the digital voltage signal will determine a route to pass a voltage to the output module 42. The output module 42 can be used to output the transformed analog voltage signal to a data line. Similar to the prior-art structure shown in FIG. 1, in the R-string digital-to-analog converter 30 of the present invention, the output module 42 also includes anindispensable loading resistor 44 for impedance matching.

Please continue to refer to FIG. 3. In the digital-to-analog converter 30, the first digit circuit 34, which corresponds to the first bit with least signal variation among the six bits of the digital voltage signal, is closest to the output module 42.

In addition, in the R-string digital-to-analog converter 30, the composition and arrangement of the PMOS transistors and the NMOS transistors are predetermined and unchangeable. For instance, the fourth digit circuit 37 corresponding to the fourth bit of the digital voltage signal includes eight PMOS transistors and eight NMOS transistors, and the arrangement of the PMOS transistors and the NMOS transistors in the fourth digit circuit 37 should conform to the embodiment shown in FIG. 3. Compared with the embodiment shown in FIG. 1, the arrangements of transistors of the first digit circuit 34 to the sixth digit circuit 39 shown in FIG. 3 is respectively the same as the arrangements of the first digit circuit 14 to the sixth digit circuit 19 shown in FIG. 1. For instance, arrangement of the PMOS transistors (P) and the NMOS transistors (N) in the first digit circuit 34 can be represented as "NNNNPPPP", which is the same as that in the first digit circuit 14 shown in FIG. 1. In other words, we exchange the positions of the first digit circuit 14 and the third digit circuit 19 shown in FIG. 1 to achieve the present invention. Therefore, the first digit circuit 34, which corresponds to the first bit with least signal variation among the six bits of the digital voltage signal, is closest to the output module 42.

Figure 2:
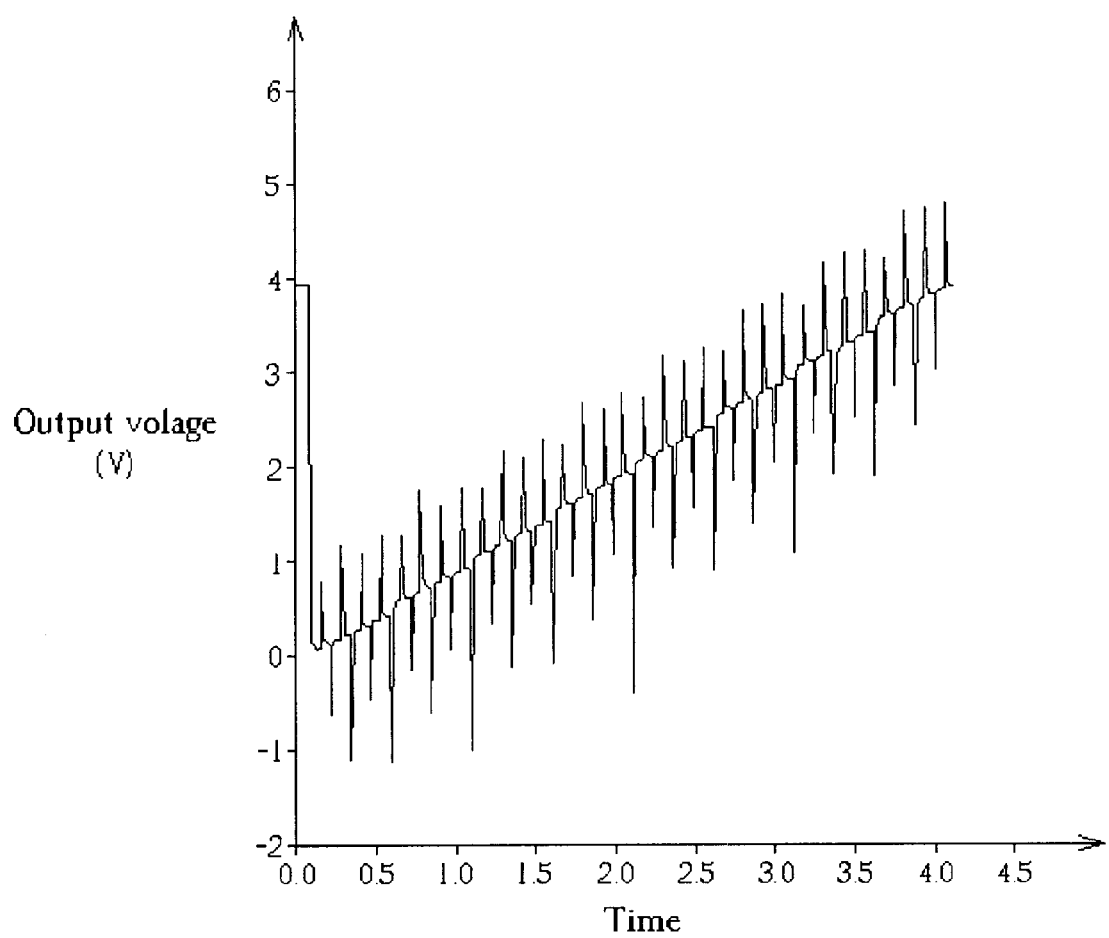
FIG. 2 is a simulation diagram of the outputted analog voltage signal of the R-string digital-to-analog converter shown in FIG. 1.
Figure 5:
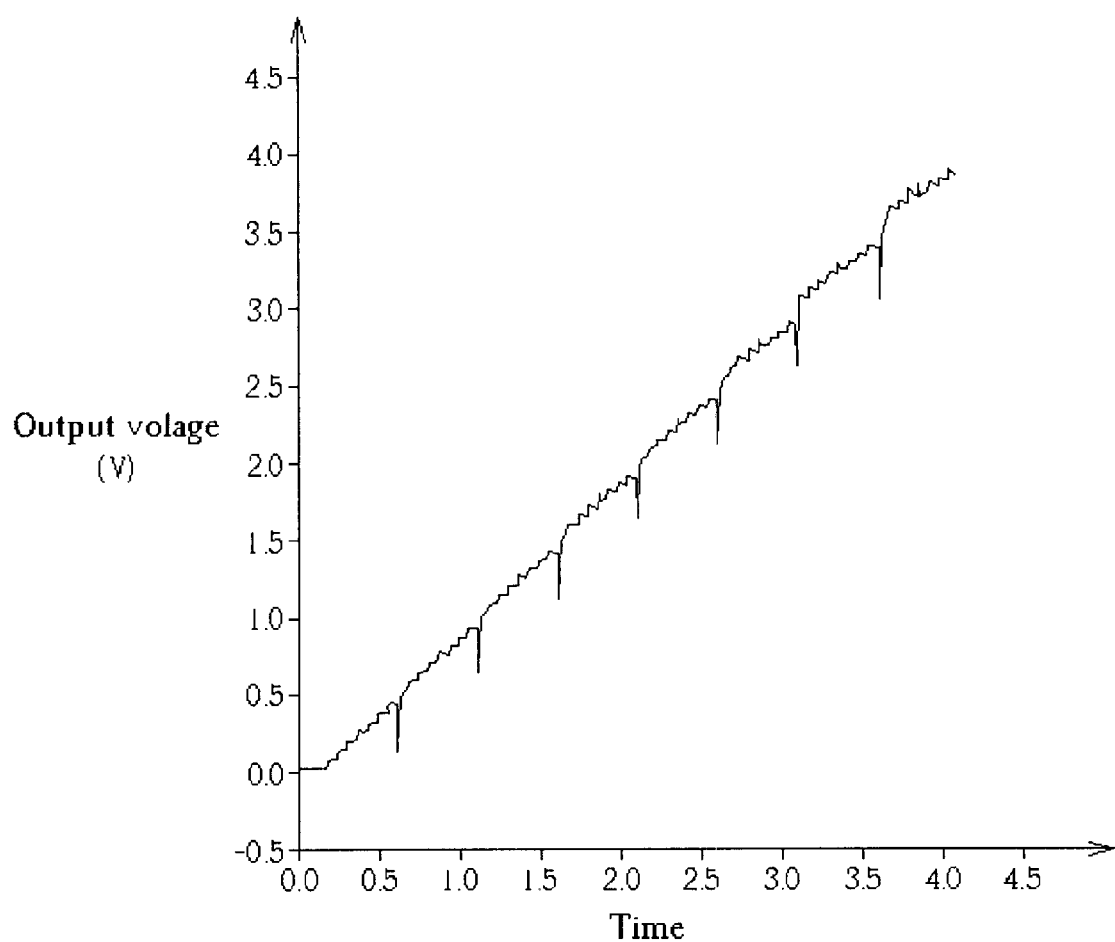
FIG. 5 is a simulation diagram of the outputted analog voltage signal of the R-string digital-to-analog converter shown in FIG. 3.

Please refer to FIG. 5, which is a simulation diagram of the outputted analog voltage signal of the R-string digital-to-analog converter 30 shown in FIG. 3. The horizontal axis represents variation of time, and the vertical axis represents variation of an output voltage. As shown in FIG. 5, the value of the analog voltage signal can reflect serious spike interference, and the maximum spike value is 0.5V, which is much smaller than the maximum spike value shown in FIG. 2. Due to that the simulation results can truthfully reflect the real performances of the circuitry, the reduced spike magnitude means a great improvement for display quality by the present invention. According to the above-mentioned problem, the loading resistor is essential and unchangeable for the digital-to-analog converter. Therefore, the present invention can provide an arrangement without modifying the loading resistor to effectively reduce spikes. That is, we can eliminate unstable displaying and redundant power consumption without the need of additional installation of electric devices.

Those skilled in the art will readily observe that numerous modifications and alterations of the device and method may be made while retaining the teachings of the invention. Accordingly, the above disclosure should be constructed as limited only by the metes and bounds of the appended claims.

What is claimed is:

1. A method for transforming a digital voltage signal into an analog voltage signal to reduce spikes by utilizing a digital-to-analog converter, the digital-to-analog converter comprising a plurality of digit circuits, the method comprising:

receiving the digital voltage signal;

setting the digit circuit corresponding to a predetermined bit of the digital voltage signal closest to an output module; and outputting an analog voltage signal corresponding to the digital voltage signal;

wherein the predetermined bit of the digital voltage signal is the bit with least signal variation among the bits of the digital voltage signal.

2. The method of claim 1, wherein each digit circuit comprises a plurality of transistors.

3. The method of claim 1, wherein the digital-to-analog converter is an R-string digital-to-analog converter.

4. The method of claim 1, wherein the output module of the digital-to-analog converter comprises a loading resistor for impedance matching.

5. A digital-to-analog converter for transforming a digital voltage signal into an analog voltage signal, the digital-to-analog converter comprising:

a receiving circuit for receiving the digital voltage signal;

a plurality of digit circuits electrically connected to the receiving circuit for transforming the digital voltage signal into an analog voltage signal corresponding to the digital voltage signal; and an output module comprising a loading resistor for impedance matching electrically connected to the digit circuits;

wherein one of the digit circuits with least signal variation among the bits of the digital voltage signal for outputting the transformed analog voltage signal is closest to the output module.

6. The digital-to-analog converter of claim 5, wherein each digit circuit comprises a plurality of transistors.

7. The digital-to-analog converter of claim 5 being an R-string digital-to-analog converter.

8. The digital-to-analog converter of claim 5 further comprising a reference circuit electrically connected to the plurality of digit circuits for providing a reference voltage for the plurality of digit circuits.

* * * * *